United States Patent [19]
Potyraj et al.

[11] Patent Number: 5,336,631
[45] Date of Patent: Aug. 9, 1994

[54] METHOD OF MAKING AND TRIMMING BALLAST RESISTORS AND BARRIER METAL IN MICROWAVE POWER TRANSISTORS

[75] Inventors: Paul A. Potyraj, Dundalk; Kenneth J. Petrosky; John A. Ostop, both of Severna Park, all of Md.

[73] Assignee: Westinghouse Electric Corporation, Pittsburgh, Pa.

[21] Appl. No.: 67,192

[22] Filed: May 26, 1993

[51] Int. Cl.$^5$ ............................................. H01L 21/70
[52] U.S. Cl. ................................. 437/60; 437/918; 437/190; 437/192; 148/DIG. 136
[58] Field of Search ............. 437/60, 55, 918, 190, 437/192; 148/DIG. 136

[56] References Cited

U.S. PATENT DOCUMENTS

| | | | |
|---|---|---|---|
| 4,197,551 | 4/1980 | Adlerstein | 357/15 |
| 4,374,012 | 2/1983 | Adlerstein | 204/192 |
| 4,755,480 | 7/1988 | Yau et al. | 437/60 |
| 5,013,677 | 5/1991 | Hozumi | 437/918 |
| 5,030,588 | 7/1991 | Hosaka | 437/918 |
| 5,068,201 | 11/1991 | Spinner, III et al. | 437/918 |

FOREIGN PATENT DOCUMENTS

| | | | |
|---|---|---|---|
| 0255264 | 10/1989 | Japan | 437/918 |
| 0119221 | 5/1990 | Japan | 437/918 |
| 0303064 | 12/1990 | Japan | 437/918 |
| 0104118 | 5/1991 | Japan | 437/918 |

Primary Examiner—Tom Thomas
Assistant Examiner—Tuan Nguyen
Attorney, Agent, or Firm—Eugene LeDonne

[57] ABSTRACT

A method for fabricating microwave power transistor elements onto a semiconductor body. An oxidizable barrier material is applied onto the wafer that both acts as a barrier to prevent diffusion between the contact metal of the transistor and the silicon and also acts as a ballast resistor. A contact metal layer is then deposited onto the barrier material at selected locations and the excess barrier material is removed. Barrier material is left between the contact metal and the silicon and at the selected ballast resistor locations. The ballast resistors may then be trimmed, increasing the value of the resistors, by oxidizing a thin surface layer of the exposed barrier material at the ballast resistor locations.

15 Claims, 1 Drawing Sheet

METHOD OF MAKING AND TRIMMING BALLAST RESISTORS AND BARRIER METAL IN MICROWAVE POWER TRANSISTORS

BACKGROUND OF THE INVENTION

1. Field of the Invention

The invention relates generally to semiconductor devices having resistors and more particularly to semiconductor devices constructed for operation in the microwave frequency ranges.

2. Description of the Prior Art

High power microwave silicon transistors involve a large number of elements each producing a high level of current. Inevitably, resistive losses lead to Joule heating of the silicon. In bipolar transistors, the current is proportional to reciprocal temperature; that is the current increases quickly as the temperature increases. Because of this characteristic of bipolar transistors, thermal runaway eventually ensues leading to the ultimate failure of the device. The onset of thermal runaway can be delayed by adding a ballast resistor in series with each element or group of elements (for example, emitter fingers in an interdigitated design). These ballast resistors which provide negative feedback to the emitter-base junction, preventing thermal runaway, may be formed in a number of ways. In one approach, a material, such as boron, may be diffused into the silicon. In this approach, the resistivity of the diffusion material is utilized as the resistor. However, the diffused silicon also has a negative coefficient of resistivity, reducing the feedback effect of the ballast resistor. It would be advantageous to use a ballast resistor having a positive coefficient of resistivity. In another approach, a relatively large segment of a metal such as aluminum is placed between the current elements. Aside from the size drawbacks, this approach has the drawback of the metal segment contributing parasitic capacitance.

A preferred type of ballast resistor is the thin film resistor. The thin film ballast resistor is created by applying a thin film of material having a selected resistivity between current elements. For all methods of forming resistors, control is an issue. For thin film resistors, it is often difficult to effectively control the film thickness and linewidth, thus the actual resistance of the thin film resistor may deviate from the desired value.

The particular value of the ballast resistor chosen in such applications is important. In addition to increasing reliability and ruggedness, this resistor affects the power gain and collector efficiency of the transistor. The accuracy of the value of the resistors is thus important.

Due to variations in film thickness, resistor pattern dimensions and the resistivity of the resistor material, precise control of the resistance of the ballast resistors is difficult to achieve. The art has attempted to correct or alter the value of the resistors after the resistors have been applied. This process is called trimming the resistors. Typical trimming techniques have involved physically removing or disconnecting resistor material with a laser. Size and cost considerations make this technique extremely impractical when dealing with a large number of resistors. Thus, it would be advantageous to provide a practical means for fine tuning the resistance of the ballast resistors after the resistor material has been applied.

Aluminum is commonly used as the primary contact metal for silicon integrated circuits. For high power devices where electromigration is a serious problem, gold may be preferred. For either case, a barrier metal is needed to prevent diffusion of the primary contact metal into the underlying silicon or silicideo. Thus, it would be advantageous to provide a method of simultaneously providing the barrier metal and the ballast resistors in a single layer of material deposition.

SUMMARY OF THE INVENTION

We provide a method for fabricating microwave power transistor elements on silicon wafers. The process involves sequentially applying and removing layers of materials onto a semiconductor body. The semiconductor body serves as a base for the formation of transistor elements. Once the semiconductor body has been suitably shaped and processed, a thin film of a barrier material is applied, preferably by sputter deposition, in a blanket fashion over the semiconductor body. A barrier material is chosen that can carry an electric current while having a selected resistivity. The barrier material is applied in a thickness greater then the thickness necessary to achieve the desired resistance, thus having a resistance that is lower than what will be needed for the ballast resistors.

Layers of contact metal which provide the external contact to other integrated circuit elements are then successively placed in a blanket fashion on the barrier material, preferably using a standard lift-off photolithographic sequence. The contact metals are preferably applied by an evaporator, but may also be sputter deposited.

The ballast resistors are then patterned using a standard photolithographic cycle. At this point, some portions of the barrier material lie beneath the contact metal and other portions lie beneath the photoresist. The contact metals and the photoresist both act as a mask to the barrier material. The barrier material that is left unprotected by either the contact metal or the photoresist material is then removed preferably by reactive ion etching. In the alternative, chemical etching may be employed to remove the unmasked barrier material.

The-barrier material which had been masked by the photoresist material and thus is not covered by contact metal will be located so as to connect transistor elements, acting as the ballast resistors. The values of the resistors may then be checked using simple DC tests. The value of the resistors may be increased in a well controlled trimming process. The resistors are trimmed by oxidizing a thin surface layer of the exposed barrier material at the ballast resistor locations. This reduces the amount of material that is left to form a conducting path, thus increasing the resistance of the path. The oxidation is preferably performed by placing the wafer in a furnace having an oxidizing ambient. Alternatively, other heating elements that can provide an oxidizing ambient, such as a rapid thermal anneal system, may be used to oxidize the barrier material as may an oxidizing chemical applied to the surface of the barrier material.

When oxidation is accomplished in an oxidizing furnace, a temperature must be chosen that provides for a reasonable oxidation rate but that is less than a temperature that will cause the migration or diffusion of the contact metal into the silicon.

Titanium tungsten alloy is the preferred barrier material since it oxidizes at a relatively low temperature of below 400° C. and has a positive coefficient of resistivity, thus assisting in preventing thermal runaway.

BRIEF DESCRIPTION OF THE PREFERRED EMBODIMENT

Figure 1:
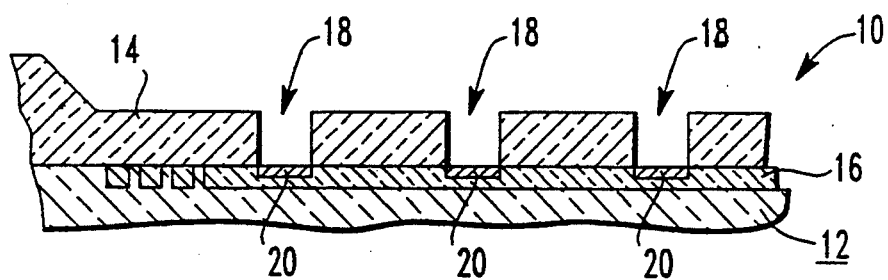
FIG. 1 is a cross sectional view of a step in the preferred fabrication sequence in which a semiconductor body has been formed on the wafer.

Referring first to FIG. 1, microwave power transistors are fabricated through a process involving sequentially applying and removing layers of material onto a semiconductor body 12. The semiconductor body 12 is formed by methods that are well known in the art. Generally, the semiconductor body 12 is formed by successively doping a silicon wafer 10 with n-type and p-type dopents by implanting and annealing or by diffusion methods. The sequence for forming the semiconductor body further includes growth or deposition of a dielectric layer 14 which allows for the separation and insulation of the silicon from the current-carrying elements of the integrated circuits and allows openings called windows 18 to be created onto the semiconductor body 12. Windows 18 are transistor element geometries that are cut into the dielectric layer 14 exposing at these locations the silicon material 16.

A metal, preferably platinum, is then blanket deposited over the entire wafer 10 and the wafer 10 is subjected to a heat treatment which allows the metal to react with the silicon 16 at the locations in windows 18 where silicon 16 was exposed on the wafer. The product of the metal-silicon reaction forms a low contact resistance path from the transistor elements to the silicon 16. The excess metal is then removed.

Figure 2:
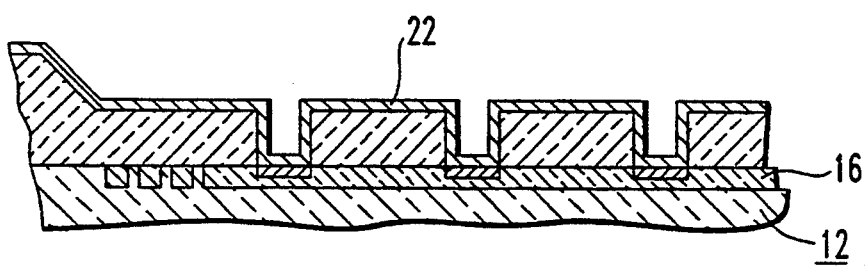
FIG. 2 is a view similar to FIG. 1 in which the barrier material has been applied to the semiconductor body.

Referring next to FIG. 2, a thin film of a barrier material 22, preferably a titanium tungsten alloy, is then sputter deposited in a blanket fashion over the semiconductor wafer 10. The barrier material 22 is applied in a layer having a thickness greater than the thickness necessary to achieve the desired resistance of the ballast resistors. Thus, the layer of barrier material 22 will have a resistance that is lower than that which will be needed for the ballast resistors.

Figure 3:
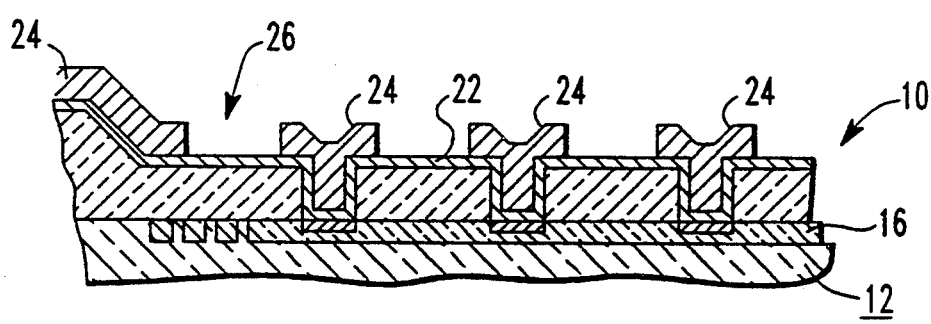
FIG. 3 is a view similar to FIG. 2 in which the contact material has been applied to selected locations.

At least one and perhaps several layers of selected contact metals 24 will then be deposited at selected locations upon the barrier material 22 as shown in FIG. 3. The contact metals 24 provide an external contact between and among the integrated circuit elements. The layers of contact metal 24 are applied through a lift off photo sequence which is well known in the art.

Between patterning the photoresist and depositing the contact metals 24, a surface clean is performed. The surface clean consists of a chemical applied to the barrier material 22 to remove any oxidized barrier material 22 where the contact metal 24 is to be applied upon the barrier material 22.

The contact metals 24 include a primary current carrying metal as well as other metal layers which act as diffusion barriers and adhesion layers. Gold is the preferred contact metal 24 for the primary current carrying metal, although aluminum may also be used.

The contact metals 24 are preferably applied by an evaporator but may be applied by other anistropic means. Evaporation techniques are well known in the art. The layers of contact metal 24 are blanket deposited upon the barrier material 22 and on the photoresist pattern. The excess contact metal 24 which had been deposited on the photoresist is then removed from the wafer 10 using standard lift-off techniques.

Figure 4:
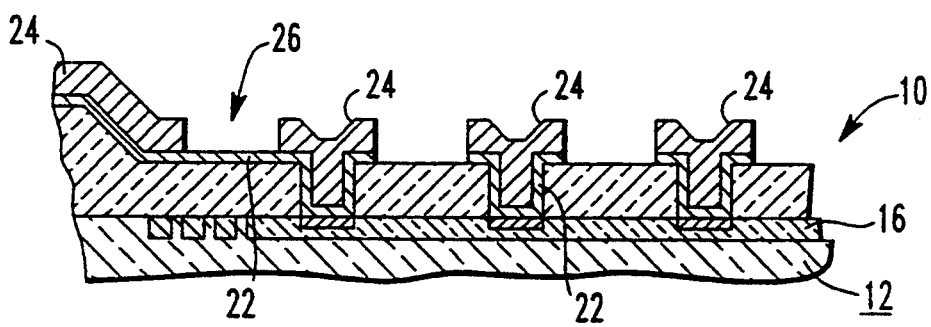
FIG. 4 is a view similar to FIG. 3 in which excess barrier material has been removed.

Referring next to FIG. 4, the ballast resistors 26 are then patterned using a standard photolithographic cycle. At this point, some portions of barrier material 22 lie beneath the contact metal 24 and other portions lie beneath the photoresist material. The barrier material 22 that is unprotected by either the contact metal 24 or the photoresist material is then removed. The contact metals 24 and the photoresist material both act as a mask to the barrier material 22. The excess, unmasked barrier material 22 may be removed by any convenient means such as by chemical etching, but preferably by reactive ion etching. Reactive ion etching is preferred because it etches primarily vertically into the wafer without etching laterally beneath the contact metal 24 or the photoresist. After etching the barrier material, the photoresist is removed using standard methods.

The values of the ballast resistors 26 which are the portions of the remaining barrier material 22 that are not protected by the contact metal 24 may now be checked using simple DC tests. Because the barrier material 22 had been initially deposited with a thickness greater than necessary, the value of the resistors 26 will be lower than is desired. The value of the ballast resistors 26 may then be increased as needed by a relatively well controlled process for trimming the resistors.

Figure 5:
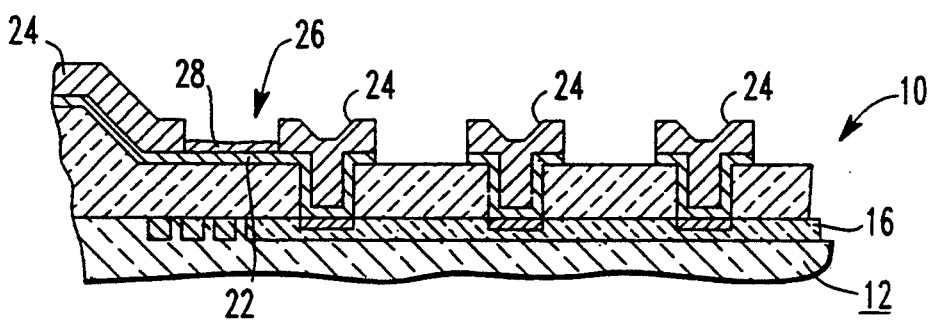
FIG. 5 is a view similar to FIG. 4 in which the barrier material has been trimmed at the ballast resistor locations.

The preferred manner of reducing or trimming the resistance of the ballast resistors 26 is performed by oxidizing a thin surface layer of the exposed barrier material 22 at the ballast resistor locations as shown in FIG. 5. Thus, a thin oxidized layer 28 is formed on the barrier material 22. This layer of oxidized material 28 is essentially unconductive, therefore, the amount of barrier material 22 that remains to form a conducting path is reduced. With the reduced path of conducting material for the current to flow through, the resistance of the path is increased. The oxidized layer 28 is preferably formed by placing the wafer 10 within a heating element that has an oxidizing ambient. The heating element is preferably a furnace but may be any heating element that can provide an oxidizing ambient, such as a rapid thermal anneal system. Irrespective of the heating technique, a temperature must be chosen that provides for a reasonable oxidation rate but that is less than a temperature that will cause a migration or diffusion of the contact metal 24 into the silicon 16. For this reason, the selection of the proper barrier material 22 includes choosing a material which oxidizes at a temperature of less than the temperature at which the barrier metal fails.

Titanium, tungsten, molybdenum and their alloys are just some examples of materials that may be used as a barrier material 22 as each have barrier properties and are oxidizable. However, titanium tungsten alloy is the preferred barrier material since it oxidizes at a relatively low temperature of below 400° C. and has suitable resistivity. Furthermore, titanium tungsten has a positive coefficient of resistivity and will thus assist in preventing thermal runaway.

Although a furnace is a preferred method of oxidizing the surface of the barrier material 22, any method that would provide controllable oxidation of the exposed, unmasked surface of the barrier material 22 may be used. One such means is by applying chemicals that will oxidize the surface of the barrier material 22. Examples of such chemicals include hydrogen peroxide and sulfuric acid.

While a present preferred embodiment of the invention has been shown, it is distinctly understood that the invention is not limited thereto but may be otherwise variously embodied within the scope of the following claims.

We claim:

1. A method of making a transistor having current elements made of at least one contact metal, the transistor further having ballast resistors connecting selected current elements, comprising the steps of:
    (a) providing a body of semiconductor material;
    (b) depositing a layer of barrier material onto the semiconductor material, the barrier material having a selected resistance;
    (c) placing current elements on the barrier material by depositing at least one layer of contact metal at selected locations on the barrier material;
    (d) removing selected portions of barrier material so as to leave barrier material beneath all contact metal and at selected ballast resistor locations between selected contact metal locations such that the barrier material also forms the ballast resistors; and
    (e) increasing the resistance of the barrier material at the ballast resistor locations; wherein the resistance of the barrier material is increased by oxidizing an exposed surface of the barrier material at the ballast resistor locations.

2. The method of claim 1 wherein the barrier material is oxidized by heating the transistor in a furnace.

3. The method of claim 1 wherein the barrier material is oxidized by heating the transistor in a rapid thermal anneal system.

4. The method of claim 1 wherein the barrier material is a material having a positive coefficient of resistivity.

5. The method of claim 1 wherein the barrier material is a material selected from the group consisting of titanium, tungsten, molybdenum and alloys thereof.

6. The method of claim 1 wherein the at least one contact metal is selected from the group consisting of aluminum, titanium, platinum, gold, chromium, aluminum-copper and aluminum-silicon.

7. The method of claim 1 wherein the at least one layer of contact metal is deposited by evaporation deposition.

8. The method of claim 1 wherein the at least one layer of contact metal is deposited by sputtering the contact metal onto the barrier material.

9. The method of claim 1 wherein the barrier material is oxidized by heating the transistor in a partially oxidizing ambient.

10. The method of claim 9 wherein the barrier material is oxidized by heating the transistor at a temperature above 300 degrees Celsius and below the eutectic point of the contact metal.

11. The method of claim 1 wherein the barrier material is oxidized by applying an oxidizing chemical to the surface of the barrier material.

12. A method of making an integrated circuit device having current elements made of at least one contact metal, the integrated circuit device further having ballast resistors connecting selected current elements, comprising the steps of:
    (a) providing a body of semiconductor material;
    (b) depositing a layer of barrier material having a selected resistance;
    (c) placing current elements on the barrier material by depositing at least one layer of contact metal at selected locations on the barrier material;
    (d) removing selected portions of barrier material so as to leave barrier material beneath all contact metal and at selected ballast resistor locations between selected contact metal locations such that the barrier material also forms the ballast resistors; and
    (e) increasing the resistance of the barrier material at the ballast resistor locations; wherein the resistance of the barrier material is increased by oxidizing an exposed surface of the barrier material at the ballast resistor locations.

13. The method of claim 12 wherein the barrier material is oxidized by heating the integrated circuit device in a partially oxidizing ambient.

14. The method of claim 12 wherein the barrier material is oxidized by applying an oxidizing chemical to the surface of the barrier material.

15. The method of claim 12 wherein the integrated circuit device is a transistor.

* * * * *